(12) United States Patent
Ramirez et al.

(10) Patent No.: US 8,894,803 B2
(45) Date of Patent: Nov. 25, 2014

(54) APPARATUS AND METHOD FOR ETCHING THE SURFACE OF A SEMICONDUCTOR SUBSTRATE

(75) Inventors: Jorge Ramirez, Glendale, CA (US); Hector Joel Castaneda, Lynwood, CA (US); Melissa A. Tiongco, Glendale, CA (US)

(73) Assignee: Heateflex Corporation, Arcadia, CA (US)

( * ) Notice: Subject to any disclaimer, the term of this patent is extended or adjusted under 35 U.S.C. 154(b) by 1680 days.

(21) Appl. No.: 12/042,584

(22) Filed: Mar. 5, 2008

(65) Prior Publication Data
US 2009/0227114 A1 Sep. 10, 2009

(51) Int. Cl.
*H01L 21/306* (2006.01)
*H01L 31/0236* (2006.01)
*H01L 21/67* (2006.01)

(52) U.S. Cl.
CPC .... *H01L 31/02363* (2013.01); *H01L 21/67086* (2013.01); *Y02E 10/50* (2013.01)
USPC .......... 156/345.11; 156/345.18; 257/E21.215

(58) Field of Classification Search
USPC ................ 156/345.11, 345.18; 257/E21.215
See application file for complete search history.

(56) References Cited

U.S. PATENT DOCUMENTS

| | | | |
|---|---|---|---|
| 4,229,233 A | 10/1980 | Hansen et al. | |
| 4,252,865 A | 2/1981 | Gilbert et al. | |
| 4,746,397 A * | 5/1988 | Maeda et al. | 216/90 |
| 4,980,017 A | 12/1990 | Kaji et al. | |
| 5,370,142 A * | 12/1994 | Nishi et al. | 134/61 |
| 5,374,325 A * | 12/1994 | Cannizzaro, Jr. | 156/345.11 |
| 5,887,602 A * | 3/1999 | Iwama | 134/43 |
| 6,132,523 A * | 10/2000 | Okuda et al. | 134/36 |
| 6,156,968 A | 12/2000 | Nishimoto et al. | |
| 6,207,890 B1 | 3/2001 | Nakai et al. | |
| 6,228,211 B1 | 5/2001 | Jeong | |
| 6,391,145 B1 | 5/2002 | Nishimoto et al. | |
| 6,663,944 B2 | 12/2003 | Park et al. | |
| 6,752,897 B2 | 6/2004 | Jang et al. | |
| 6,758,940 B2 * | 7/2004 | Chiu | 156/345.15 |
| 6,780,277 B2 * | 8/2004 | Yokomizo et al. | 156/345.11 |
| 7,128,975 B2 | 10/2006 | Inomata | |
| 2003/0101616 A1 * | 6/2003 | Scranton et al. | 34/467 |
| 2006/0054191 A1 * | 3/2006 | Higuchi et al. | 134/34 |
| 2009/0227114 A1 * | 9/2009 | Ramirez et al. | 438/745 |

* cited by examiner

*Primary Examiner* — Sylvia R MacArthur
(74) *Attorney, Agent, or Firm* — Kelly & Kelley, LLP

(57) ABSTRACT

A process for etching the surfaces of semiconductor substrates utilizes a texturing tank which introduces a process fluid through a circulating system. The process fluid is heated to a desired temperature and maintained at a desired concentration prior to entering a processing area where laminar flow is produced to more quickly and uniformly roughen the surface of semiconductor substrates. The texturing tank permits removal of bubbles and eliminates temperature stratification in the processing area.

12 Claims, 5 Drawing Sheets

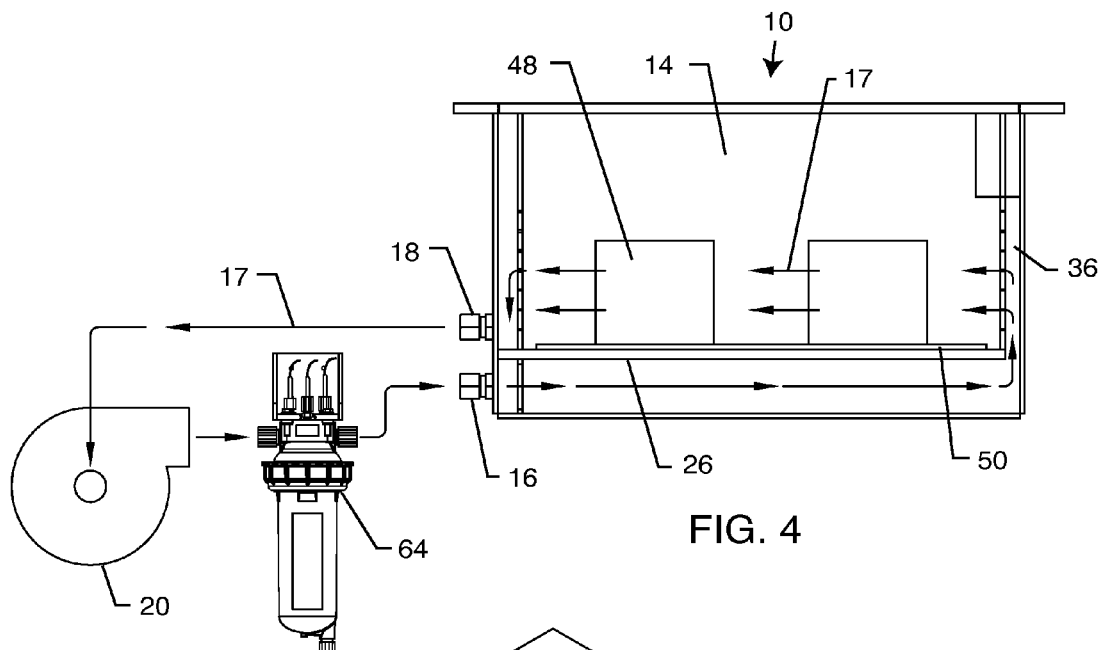
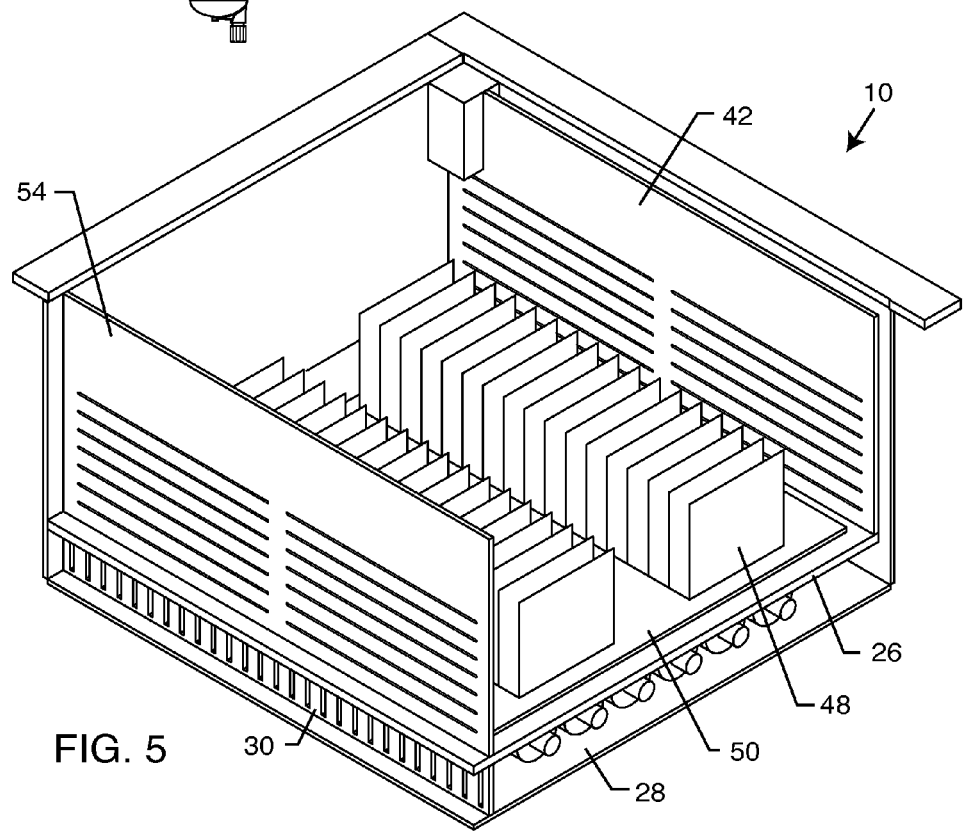

APPARATUS AND METHOD FOR ETCHING THE SURFACE OF A SEMICONDUCTOR SUBSTRATE

FIELD OF THE INVENTION

The present invention relates to an etching bath for etching the surfaces of semiconductor substrates, primarily silicon. In particular, the present invention relates to a texturing tank and a process used therein in the fabrication of a non-reflective surface on silicon solar cells.

BACKGROUND OF THE INVENTION

Solar cells are devices that convert light energy incident to its surface into electrical energy. Past efforts and ongoing research have led to improved efficiency by finding methods to convert more of the incident light energy into electrical energy. Several such improvements involve processes for roughening or texturing the surface of the solar cell substrate in order to reduce its reflective quality and therefore absorb more incident light for conversion. The texturing procedures improve the silicon solar efficiency by forming minute projections and recesses on the surface so that incident light is absorbed rather than reflected.

Various methods have been proposed in the prior art to achieve the desired textured silicon surface on a solar cell. The following patents describe some of the methods developed to texture a solar cell substrate.

U.S. Pat. No. 7,128,975 to Inomata entitled Multicrystalline Silicon Substrate and Process for Roughening Surface Thereof describes a process involving a wet etching step to form large irregularities followed by a dry etching step to form a multiplicity of fine textures over the large irregularities. The use of both wet etching and dry etching is a drawback U.S. Pat. No. 6,752,897 to Jang et al. entitled Wet Etch System With Overflow Particle Removing Feature describes a wet etch system for removing particulate impurities from an etching liquid. The impurities are removed by causing a displacement of a significant amount of etchant into an overflow section of the tank by inserting a wafer carrier with a fixed volume into a full process tank. Fresh etchant is poured into the etch bath chamber prior to a subsequent etch cycle. The Jang patent does not recirculate used etchant.

U.S. Pat. No. 6,663,944 to Park et al. entitled Textured Semiconductor Wafer for Solar Cell describes a method for forming a plurality of random grooves on a surface of a semiconductor wafer. The grooves are formed by randomly depositing a protector on the surface and then dipping the wafer into an isotropic etching solution to etch the surface where the protector is not deposited. The need to deposit and later remove a protector layer adds extra steps.

U.S. Pat. Nos. 6,391,145 and 6,156,968 to Nishimoto et al. both entitled Solar Cell, a Method of Producing the Same and a Semiconductor Producing Apparatus describe a method whereby projections and recesses are uniformly formed on the surface of a silicon substrate by dipping in a wet etching solution. Spherical projections and recesses are formed on the surface of the substrate. The apparatus describes a multi tank configuration wherein one tank has recirculation of the etching solution and a means to maintain concentration of processed chemicals. The use of multiple tanks creates unneeded complexity.

U.S. Pat. No. 6,228,211 to Jeong entitled Apparatus for Etching a Glass Substrate describes an apparatus wherein a container includes a bubbling plate at the bottom thereof. The glass substrate to be etched is placed in the container where a liquid etchant is passed through holes in a porous plate to react with the surface of the substrate. Bubbles produced by the bubbling plate also pass through the holes in the porous plate to mix the liquid etchant and remove impurities from the surface of the glass substrate. The Jeong patent creates turbulent flow in the processing area and generates bubbles that can hinder the etching process.

U.S. Pat. No. 6,207,890 to Nakai et al. entitled Photovoltaic Element and Method for Manufacture Thereof describes an element that directly converts optical energy into electrical energy. The process involves forming many uneven sections on the surface of a silicon substrate then isotropically etching the surface. The bottoms of recessed sections are rounded and a p-type amorphous silicon layer is formed on the surface. The rounded bottom recesses allow an amorphous silicon layer to be deposited in a uniform thickness. Hydrogen bubbles created during the process attach to the substrate and prevent the alkali from reaching the surface at the point of attachment.

U.S. Pat. No. 4,980,017 to Kaji et al. entitled Method for Recirculating High-Temperature Etching Solution describes a method for recirculating a high temperature etching solution wherein the portion of an etching solution contained in an etching bath is continuously removed and a predetermined amount of pure water for adjusting the concentration of the etching solution is injected into the removed solution. The removed solution is then reheated to a predetermined temperature and recirculated into the etching bath. The described method does not produce a uniform flow rate or remove bubbles.

U.S. Pat. No. 4,252,865 to Gilbert et al. entitled Highly Solar-Energy Absorbing Device and Method of Making the Same uses sputtering to create a device wherein the surface of an amorphous semiconductor material has a particular characterization in that an array of outwardly projecting structural elements of relatively high aspect ratio and at effective lateral spacings on the order of magnitude of wave lengths within the solar energy spectrum.

U.S. Pat. No. 4,229,233 to Hansen et al. entitled Method for Fabricating Non-Reflective Semiconductor Surfaces by Anisotropic Reactive Ion Etching describes a process that takes place in a reactive ion etching tool, typically a diode configured system employing ambient gases which react with the silicon.

There are a number of drawbacks involved with the above-described methods and devices. Several of the processes utilize a dry etch or employ a wet etch system that does not involve a pump or recirculation of the etching solution. Other systems require the deposition of a protector on the surface to be etched. Still other processes describe the use of turbulent flow and a bottom tank inlet. In such prior art devices it is difficult to obtain a uniform flow rate across the semiconductor surface. Still other prior art patents describe an etching process that includes sputtering or a reactive ion etching chamber.

Accordingly, there is a need for an etching process and apparatus that enhances and speeds up the etching by providing more control over critical variables such as temperature uniformity, bubble removal and flow rate across the surface to be etched. In addition, a process is needed that produces laminar flow across the surface of the substrate. Further, a means of preventing attachment of bubbles or particles to the surface of the substrate is needed. The following invention provides these and other related advantages.

SUMMARY OF THE INVENTION

The present invention is directed to a process for etching the surface of a semiconductor substrate and an apparatus embodying said process. The process comprises the steps of introducing a process fluid having an initial concentration of an isotropic etching agent to a texturing tank. The process fluid is degassed and a uniform, laminar flow is produced in the process fluid. The semiconductor substrate to be etched is placed into a laminar flow segment of the process fluid and the surface of the semiconductor substrate is etched in the laminar flow segment of the process fluid.

The process further comprises the step of dispersing the process fluid through an inlet baffle to produce turbulent flow through a heater area of the texturing tank prior to the degassing step. The process fluid is heated in this heater area prior to the degassing step. The temperature of the process fluid is monitored in the texturing tank.

The degassing step comprises the step of introducing the process fluid to a preprocessing area. The process fluid flows through a vertical chamber in the preprocessing area. Gasses and bubbles in the process fluid are allowed to escape from an air interface surface in this vertical chamber. Uniform, laminar flow of the process fluid is produced by passing the process fluid through an entry diffuser after the degassing step.

The process fluid is premixed with an interface active agent prior to being introduced into the texturing tank. After the etching step the process fluid passes through an exit baffle. An isotropic etching agent is added to the process fluid after the etching step in order to restore the process fluid to the initial concentration. The process fluid is recirculated from the exit baffle back to the introducing step.

The apparatus for employing the above method comprises a texturing tank having an inlet and an outlet and defining a flow path therebetween for a process fluid. The flow path includes a preprocessing area and a downstream processing area. A degasser in the preprocessing area removes gasses and bubbles in the process flow. An entry diffuser in the flow path disposed between the preprocessing area and the processing area creates a uniform, laminar flow through the processing area. The semiconductor substrate to be etched is introduced into the preprocessing area. The substrate is introduced to the processing area by a conveyor system, a wafer basket or similar means.

A mixing area is further included in the flow path subsequent to the processing area. The mixing area being for mixing chemicals into the process fluid. The apparatus also includes a pump in the flow path subsequent to the processing area. The pump being for recirculating the process fluid back to the tank inlet.

An inlet baffle in the flow path subsequent to the tank inlet disperses the process fluid across a width of the tank and creates turbulent flow in the process fluid. A heater area in the flow path subsequent to the inlet baffle heats the process fluid while in turbulent flow. The heater area includes heater elements, all of which are coated with perfluoroalkoxy. A thermocouple in the processing area measures the temperature of the process fluid.

An exit baffle in the flow path subsequent to the processing area impedes the process flow as it exits the processing area. A mixer in the flow path prior to the tank inlet mixes the process fluid with an interface active agent.

All wetted surfaces in the texturing tank are coated with polyvinylidene fluoride or perfluoroalkoxy. The preprocessing area includes a generally vertical chamber whereby bubbles and gasses in the process fluid leave the process fluid and pass through a degassing area.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the invention. In such drawings:

FIG. 4 is a schematic representation of a texturing tank embodying the present invention, including an in-line heater;

FIG. 5 is a perspective view of a texturing tank embodying the present invention, including silicon substrates in a wafer basket placed in the processing area;

DETAILED DESCRIPTION OF THE PREFERRED EMBODIMENTS

The present invention relates to a process and apparatus for etching the surfaces of semiconductor substrates, primarily silicon. In particular, the present invention relates to a recirculating texturing tank and the process employed therein. The inventive texturing tank shortens the processing time required to etch the surfaces of semiconductor substrates by creating a more uniform flow across the surface of the substrates to be etched. In current methods, manufacturers use either a static tank in which the substrates see no flow, or an overflow tank in which some substrates see a greater flow than others. By introducing flow in a controlled, uniform manner the substrates are etched quicker and more consistently. Such a system facilitates mass production utilization because greater production can be achieved in a shorter amount of time with more uniform quality. These flow characteristics also act to remove and eliminate bubbles and other particulates from the surfaces of the substrates to be etched.

Figure 1:
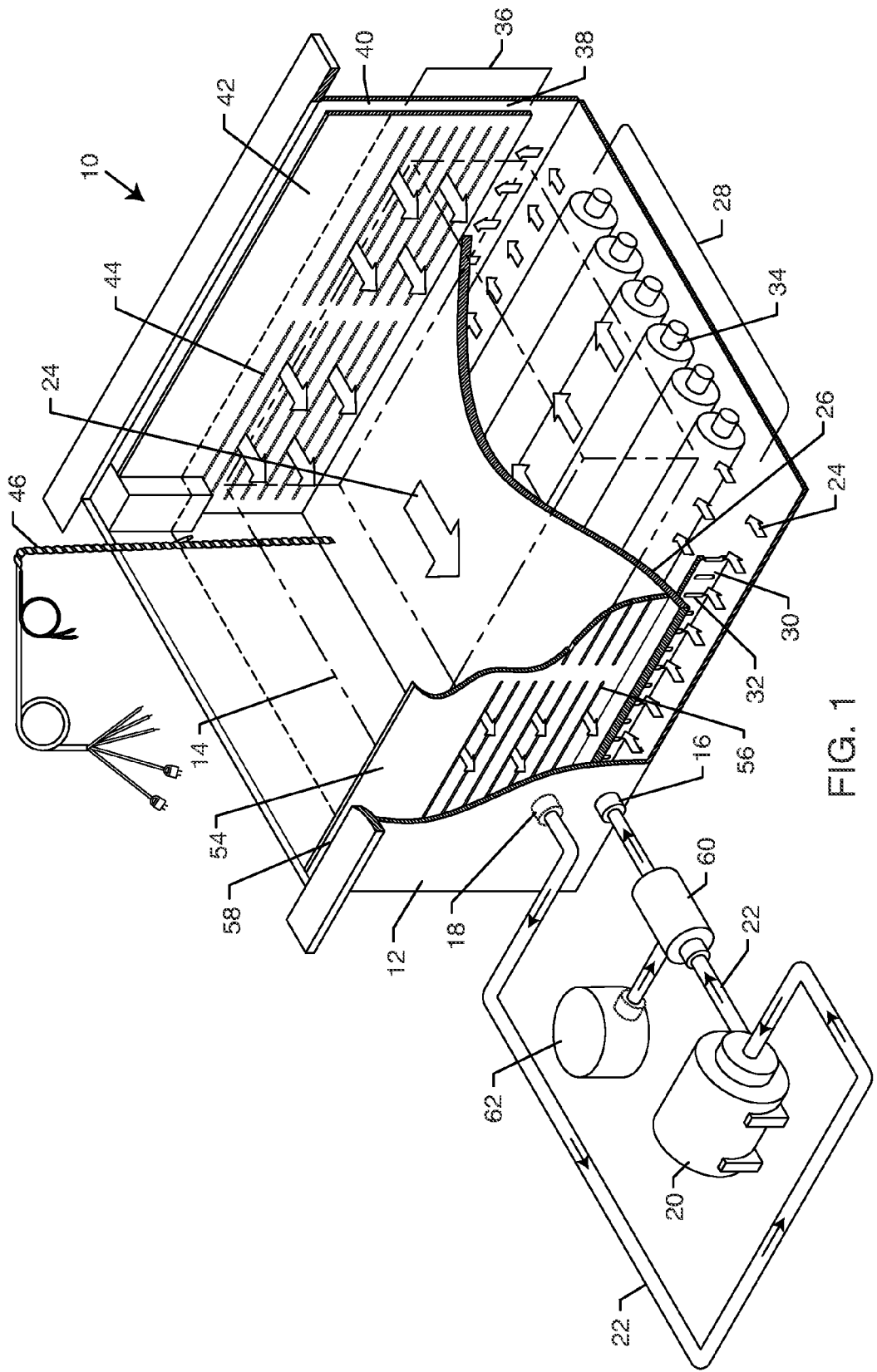
FIG. 1 is a cutaway perspective view of a texturing tank embodying the present invention.

As illustrated in FIG. 1, the texturing tank 10 consists of a housing 12 defining a processing area 14. The tank 10 includes an inlet 16 and an outlet 18, both of which pass through the housing 12. Preferably the inlet 16 and outlet 18 are positioned proximate to each other on the tank 10 to facilitate the circulatory process described below.

A pump 20 forces process fluid through a series of pipes 22 into the inlet 16. As described below, one or more of various components may be included in line with the pipes 22.

The fluid flow as depicted by arrows 24 passes through the inlet 16 entering an area of the texturing tank 10 beneath an intermediate floor 26. This intermediate floor 26 separates a heater area 28 of the tank 10 from the processing area 14. As the process fluid enters the heater area 28 it passes through an inlet baffle 30 that spans the width of the heater area 28. The inlet baffle 30 includes a series of slots or openings 32. These slots 32 force the process fluid to spread across the entire width of the heating area 28 as it is forced to flow through the inlet baffle 30.

The heater area 28 includes a series of heating elements 34 in a coil configuration to maximize surface area, occupy less space, and provide lower wattage density. The heating elements 34 are coated with perfluoroalkoxy (Teflon™). The inlet baffle 30 creates features in the flow of the process fluid through the heater area 28 such that the flow is even and the temperature is consistent throughout the width of the tank 10. This configuration for the heater area 28 provides more efficient and uniform process fluid temperature, thus avoiding temperature gradients in the process area 14. Having a uniform temperature improves the etch rate and uniformity across substrates.

After being heated, the process fluid moves to a preprocessing area 36 which consists generally of a vertical space 38 along a wall of the tank 10 opposite the inlet 16. As the process fluid enters the preprocessing area 36 and enters the vertical space 38, any bubbles or gasses trapped in the process fluid quickly rise to the top of this vertical space 38. The tank 10 is configured such that process fluid does not completely fill the tank to the top and there is a liquid/air interface at which the entrapped gasses and bubbles escape the process fluid. This liquid/air interface is part of a degassing area 40 designed to remove bubbles from the process fluid before it enters the processing area of the tank. The intermediate floor 26 may be angled slightly upward in the direction of process flow 24 such that any bubbles or gasses in the heater area 28 move toward the preprocessing area 36 and are thus permitted to escape through the degassing area 40.

An entry diffuser 42 is disposed between the preprocessing area 36 and the processing area 14. The entry diffuser 42 impedes and scatters the process fluid to create a uniform and laminar flow across the processing area 14. The entry diffuser 42 is a vertical wall and creates this laminar flow through a series of slots 44 therein. The slots 44 control how quickly the process fluid passes through the entry diffuser 42 and are conducive to creating the uniform laminar flow.

A thermocouple 46 is positioned in the processing area 14 for measuring the temperature of the process fluid. The thermocouple 46 has a feedback loop to the heating elements 34 so that the temperature of the process fluid can be adjusted in real time.

Figure 6:
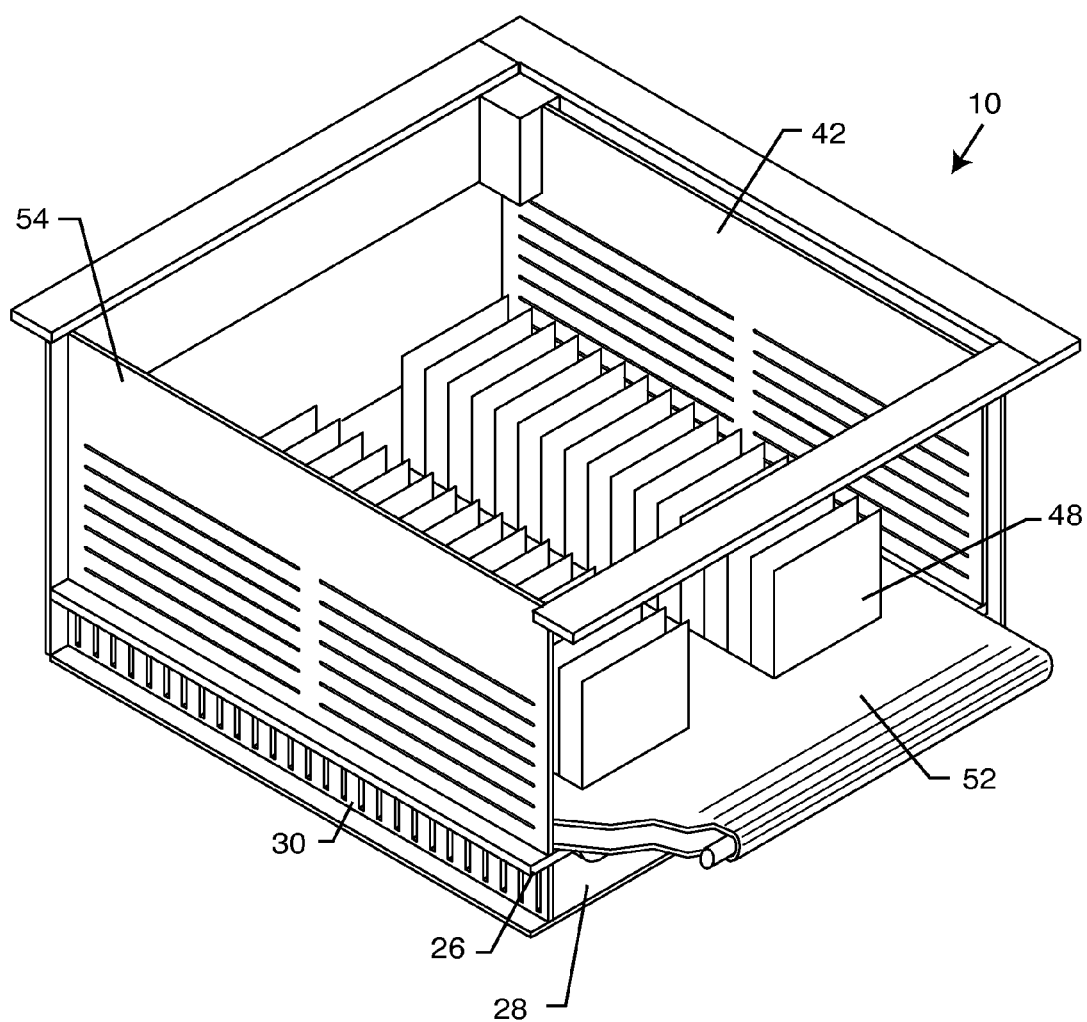
FIG. 6 is a perspective view of a texturing tank embodying the present invention, including silicon substrates on a conveyor system through the processing area.

There are various embodiments for introducing semiconductor substrates to the processing area 14. FIG. 5 illustrates an embodiment wherein a plurality of semiconductor substrates 48 are positioned in the processing area 14 by immersion of a basket 50 or similar device therein. The basket 50 may be placed in and/or removed from the processing area 14 simply by lifting the basket 50 through an open top of the texturing tank 10. FIG. 6 illustrates an alternate embodiment wherein the plurality of substrates 48 are moved through the processing area 14 on a conveyor system 52 or similar device. The conveyor system 52 passes the plurality of substrates 48 through opposite sidewalls of the texturing tank 10 such that the substrates 48 pass between the entry diffuser 42 and an exit baffle 54 described below. The conveyor system 52 orients the substrates 48 to achieve laminar flow across the surface thereof.

The exit baffle 54 is a vertical wall positioned adjacent to the processing area 14 and includes a series of slots 56 through which the process fluid passes as it leaves the processing area 14. The purpose of the exit baffle 54 is to impede the flow 24 of the process fluid so that it does not leave the processing area 14 before sufficient etching has occurred. Once through the exit baffle 54 the process fluid exits the tank 10 through the outlet 18. The processing fluid then circulates back to the pump 20 for reintroduction to the system.

At some point between the exit baffle 54 and the entry diffuser 42 a mixing area 58 should be included to introduce additional etching chemicals to assure that the process fluids are at an ideal concentration for etching the substrates 48. The mixing area 58 must be positioned in the flow of process fluid such that the process fluids will be sufficiently mixed prior to reaching the processing area 14 so as not to chemically shock the substrates 48. Preferably, this mixing area 58 immediately follows the exit baffle 54 to allow a maximum amount of time for mixing.

Figure 2:
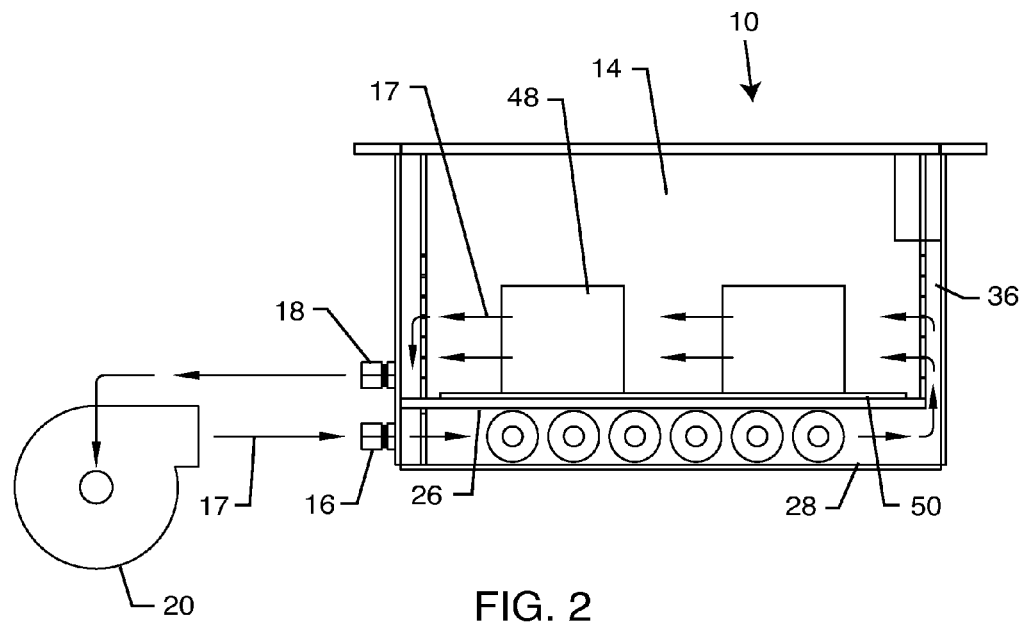
FIG. 2 is a schematic representation of a texturing tank embodying the present invention.
Figure 3:
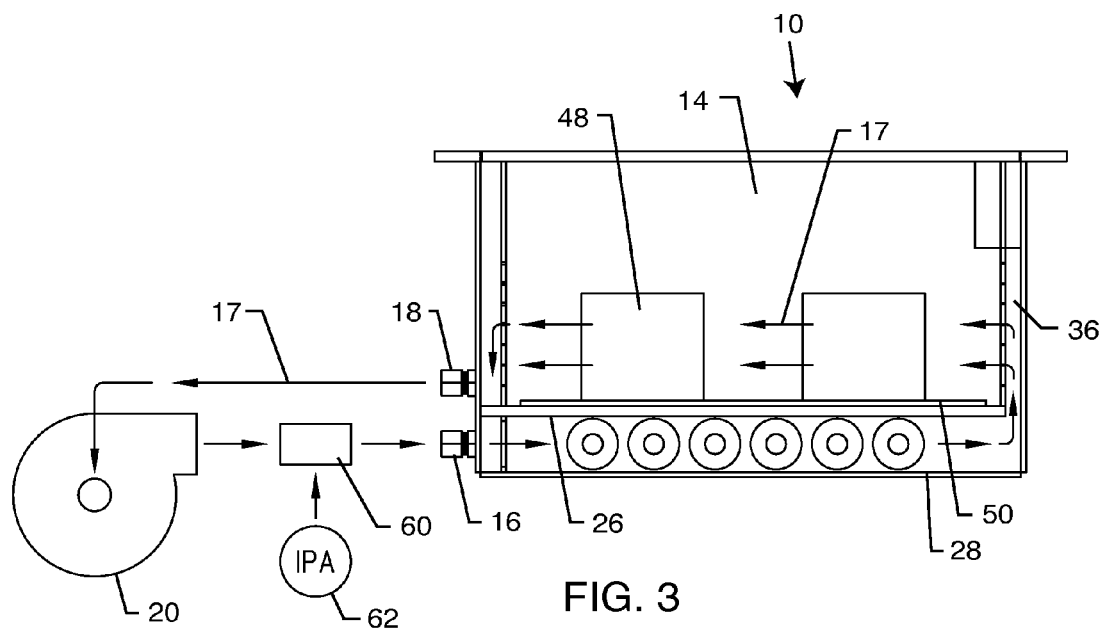
FIG. 3 is a schematic representation of a texturing tank, including an IPA mixing apparatus.
Figure 7:
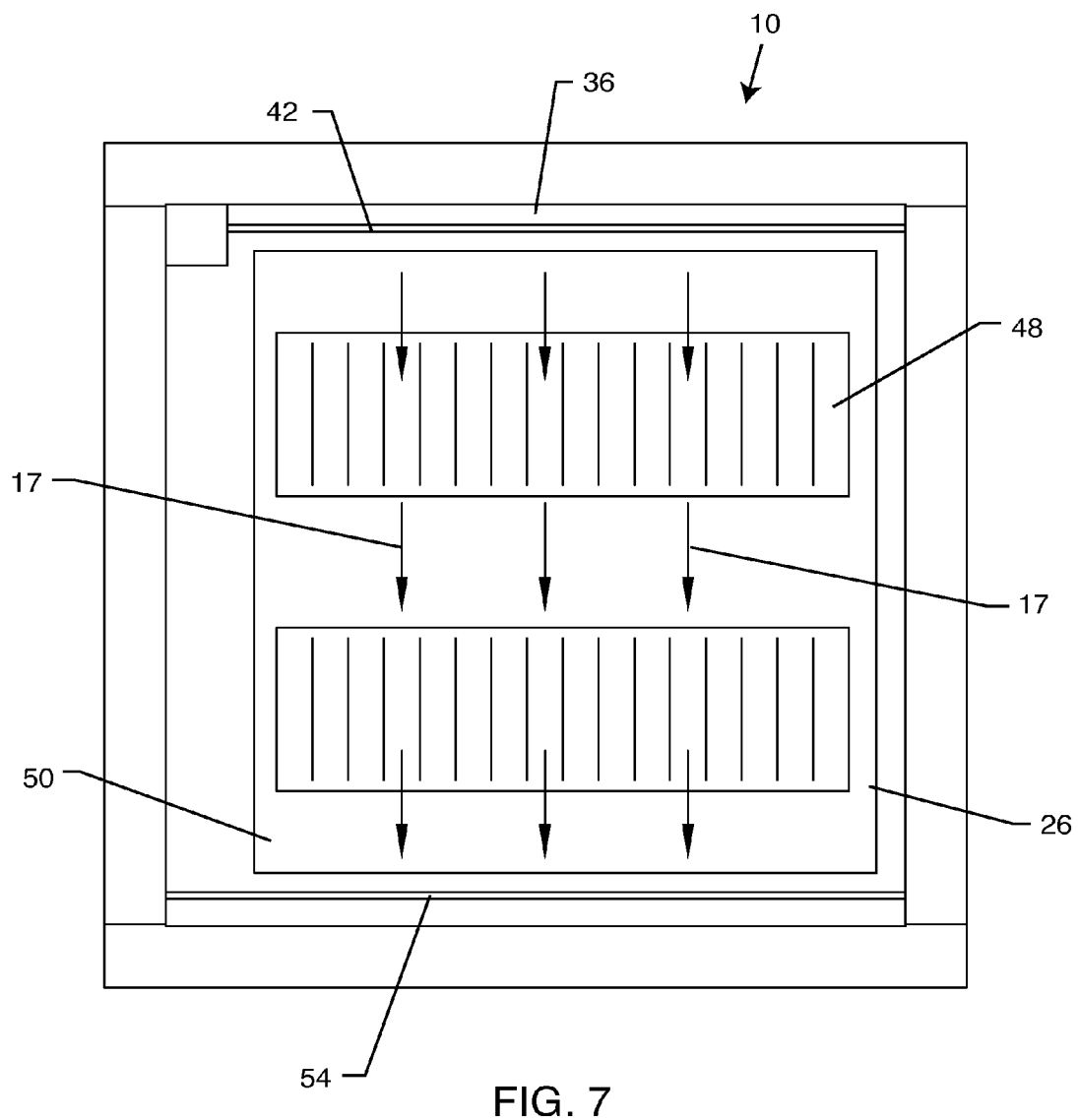
FIG. 7 is a top view of a texturing tank embodying the present invention, illustrating process fluid flowing through the processing area.

FIGS. 2, 3, 4 and 7 illustrate the process flow 17 through the circulatory system and tank 10. As illustrated in FIG. 2, the system may consist of the texturing tank 10 and the pump 20 to complete the circulatory system. As illustrated in FIG. 3, the system may also include a mixer 60 and a source 62 of interface active agent, preferably isopropyl alcohol (IPA). The interface active agent is to prevent particulates and bubbles from attaching to the surface of the substrates 48 as described in the prior art above. An agent like IPA should be introduced in a measured way to achieve a uniform and proper mix. The mixer 60 and mixing area 58 are preferably at different locations in the flow path but may be one and the same. As illustrated in FIG. 4, the circulatory system may also include an in-line heater 64 for heating the process fluid prior to entering the tank 10. The process flow 17, as clearly shown in FIG. 7 is parallel to the substrates to be etched. This orientation is conducive to the laminar flow being generated.

The process fluid preferably consists of an isotropic etching agent such as sodium hydroxide (NaOH) or potassium hydroxide (KOH). The isotropic etching agent is preferably delivered in an aqueous solution. All of the wetted surfaces in the tank 10 are preferably coated with a material to protect from damage caused by the process fluids. Protective materials include polyvinylidene fluoride (PVDF) or perfluoroalkoxy (PFA), or any such materials compatible with the etching solutions. The heaters are preferably jacketed with PFA and all other wetted surfaces with PVDF.

Although several embodiments have been described in detail for purposes of illustration, various modifications may be made without departing from the scope and spirit of the invention. Accordingly, the invention is not to be limited, except as by the appended claims.

What is claimed is:

1. An apparatus for etching the surface of a semiconductor substrate, comprising:

a texturing tank having an intermediate floor dividing the texturing tank into an upper area and a lower area, a tank inlet to the lower area, a tank outlet from the upper area, the tank inlet and tank outlet disposed proximate to one another on a side of the texturing tank, and a flow path for a process fluid from the tank inlet, through the lower area and upper area, and to the tank outlet;

a preprocessing area in the flow path comprising a vertically oriented chamber opposite the side of the texturing tank on which the tank inlet and tank outlet are disposed, the preprocessing area connecting the lower area and the upper area passing around the intermediate floor and having a means for removing gasses and bubbles from the process fluid;

a processing area in the upper area in the flow path, adjacent to and downstream of the preprocessing area;

an entry diffuser vertically disposed between the preprocessing area and the processing area, the entry diffuser comprising a wall having a plurality of horizontal slots configured to create uniform, laminar flow in the process fluid throughout the processing area;

an exit baffle vertically disposed between the processing area and the tank outlet proximate to the side of the texturing tank on which the tank inlet and tank outlet are disposed, the exit baffle comprising a wall having a plurality of horizontal slots configured to impede flow of the process fluid exiting the processing area; and means for introducing the semiconductor substrate into the processing area.

2. The apparatus of claim 1, further comprising a mixing area in the flow path subsequent to the processing area, and means for mixing chemicals into the process fluid in the mixing area.

3. The apparatus of claim 1, further comprising means for recirculating the process fluid from the tank outlet back to the tank inlet, said means for recirculating being disposed in the flow path subsequent to the processing area.

4. The apparatus of claim 1, further comprising a heating area in the lower area and means for heating the process fluid in the heating area, said heating area being disposed in the flow path between the tank inlet and the preprocessing area.

5. The apparatus of claim 4, further comprising an inlet baffle disposed in the flow path between the tank inlet and the heating area, the inlet baffle configured with a plurality of slots for dispersing the process fluid across a width of the tank in the heating area.

6. The apparatus of claim 4, wherein said means for heating comprises heater elements, said heater elements being coated with perfluoroalkoxy.

7. The apparatus of claim 4, further comprising means for measuring the temperature of the process fluid in the processing area, and a feedback loop connected to the means for measuring and the means for heating so as to regulate the temperature of the process fluid.

8. The apparatus of claim 1, wherein the entry diffuser and exit baffle work together to control the flow rate of the process fluid through the processing area.

9. The apparatus of claim 1, further comprising a mixer in the flow path prior to the tank inlet and means for introducing an interface active agent to the process fluid.

10. The apparatus of claim 1, wherein all wetted surfaces in the texturing tank are coated with polyvinylidene fluoride or perfluoroalkoxy.

11. The apparatus of claim 1, wherein the means for removing gasses and bubbles from the process fluid comprises a degasser having a liquid/air interface disposed at the top of the vertically oriented chamber whereby bubbles and gasses in the process fluid leave the process fluid through the degasser.

12. The apparatus of claim 1, wherein the exit baffle is disposed opposite from and parallel to the entry diffuser.

* * * * *